United States Patent [19]

Lee

[11] Patent Number: 5,753,311
[45] Date of Patent: May 19, 1998

[54] METHOD FOR FORMING OXIDE LAYER

[75] Inventor: Ming-Kwei Lee, Kaouhsiung, Taiwan

[73] Assignee: National Science Council, Taipei, Taiwan

[21] Appl. No.: 724,188

[22] Filed: Oct. 1, 1996

[51] Int. Cl.$^6$ .................................................. B05D 1/18
[52] U.S. Cl. ................................. 427/430.1; 427/443.2
[58] Field of Search ........................... 427/443.2, 344, 427/430.1, 337, 126.1, 343, 169

[56] References Cited

U.S. PATENT DOCUMENTS

| | | | |
|---|---|---|---|
| 4,269,654 | 5/1981 | Deckert et al. | 156/657 |
| 4,468,420 | 8/1984 | Kawahara et al. | 427/397.7 |
| 4,894,353 | 1/1990 | Ibok | 437/239 |
| 5,153,035 | 10/1992 | Sakai et al. | 427/430.1 |
| 5,506,006 | 4/1996 | Chou et al. | 427/430.1 |

*Primary Examiner*—Michael Lusignan
*Assistant Examiner*—Michael Barr
*Attorney, Agent, or Firm*—Knobbe, Martens, Olson & Bear, LLP

[57] ABSTRACT

A simple method for forming an oxide layer with improved quality is provided. Incorporation of a trace and suitable amount of alkali metal eliminating agent while forming the oxide layer enhances the deposition rate and the refractive index of the oxide layer and leads to a lower leakage current, and thus the quality of the oxide layer is improved. The present method for forming an oxide layer comprising following steps: a) providing a substrate; b) forming an oxide layer on the substrate; and c) adding an alkali metal eliminating agent while forming the oxide layer on the substrate.

14 Claims, 3 Drawing Sheets

METHOD FOR FORMING OXIDE LAYER

FIELD OF INVENTION

The present invention generally relates to a method for forming an oxide layer, and more particularly to a method for forming a liquid phase deposited silicon dioxide (LPD-$SiO_2$) layer.

BACKGROUND OF THE INVENTION

With the greater demand on the function of integrated circuit and the complexity of the circuit itself, the amount of device it contains, e.g., the transistor increases greatly. To reduce the size of the wafer, we need to put on a certain area of wafer more devices and increasedly layered metal structure and trench structure. This new structure brings about new requirements.

In the process of fabricating integrated circuit, silicon dioxide layer is applied in several ways: e.g., (1) as a mask to prevent the dopant from diffusion and implantation; (2) as an insulation between devices; or (3) as an insulation between layers in a multi-layer structure, and so on. The major prior techniques for forming silicon dioxide layer are thermal oxidation, chemical vapor deposition (CVD) and plasma enhanced CVD. In thermal oxidation, the high temperature (700° C.~1200° C.) causes the deformation of the wafer and destruction of the structure of the devices. In CVD and plasma enhanced CVD, the temperature range is 200° C.~950° C. However, the temperature is not low enough to prevent from the problems. In addition, the steps are complicated and the equipment are expensive. Thus, many efforts have been made to lower the temperature for forming a silicon dioxide layer.

Liquid phase oxide deposition (LPD) is a method for depositing silicon dioxide under low temperature. It has the following advantages: (1) The equipment is simpler and cheaper than a vacuum system. It also works to deposit silicon dioxide on a larger-area wafer. (2) The conditions for depositing silicon oxide are easy to control. (3) The growth temperature for the layer is much lower than that of CVD and plasma enhanced CVD. The structure of the wafers and the characteristics of the devices can be reserved. (4) It is exhibited with low thermal stress and good planarization ability. (5) A low leakage current density is found. (6) High dielectric breakdown strength is obtainable. (7) It has simplified the process, lowered the cost and increased the packing density. (8) It has a sound selectivity to photo-resist and $Si_3N_4$, etc.

In most LPD applications, the quality of silicon dioxide layer is still the key point. Raising the quality of the LPD-$SiO_2$ layer to meet the requirements of the application is the main purpose of the present invention.

SUMMARY OF THE INVENTION

The object of the present invention is to provide a simple method for forming an oxide layer with improved quality.

Another object of the present invention is to provide a method for increasing the deposition rate.

The other object of the present invention is to provide a method which is easy to control the conditions of process and suitable for mass-production.

In the present invention, an alkali metal eliminating agent is used while forming an oxide layer on a substrate. When a suitable amount of alkali metal eliminating agent is added, the alkali metal in the solution will be neutralized so that the deposition of oxide layer can be improved.

The present method for forming an oxide layer comprising following steps: a) providing a substrate; b) forming an oxide layer on the substrate; and c) adding an alkali metal eliminating agent while forming the oxide layer on the substrate. In a preferred embodiment, steps b) and c) together comprise the steps of: dissolving a silica gel into a hydrofluosilicic acid ($H_2F_6Si$) solution to form a supersaturated solution; filtering the supersaturated solution to separate excess undissolved silica gel from the supersaturated solution to obtain a supersaturated solution filtrate; adding a boric acid solution into the supersaturated solution filtrate to form a boron-containing solution; adding an alkali metal eliminating agent into the boron-containing solution to form a mixture solution; and immersing the substrate into the mixture solution to form the oxide layer.

The present invention can be better understood with reference to the following description and accompanying drawing, in which:

BRIEF DESCRIPTION OF THE DRAWINGS

FIG. 2B shows the effect of adding HCl upon the deposited oxide layer; and FIG. 3A and 3B show the current (I)-voltage (V) curves of the oxide layer in the present invention, wherein FIG. 3A shows the curve of the leakage current of the oxide layer in the present invention without alkali metal eliminating agent and FIG. 3B shows the curve of the leakage current of the present invention with alkali metal eliminating agent.

DETAILED DESCRIPTION OF THE PREFERRED EMBODIMENT

Figure 1:
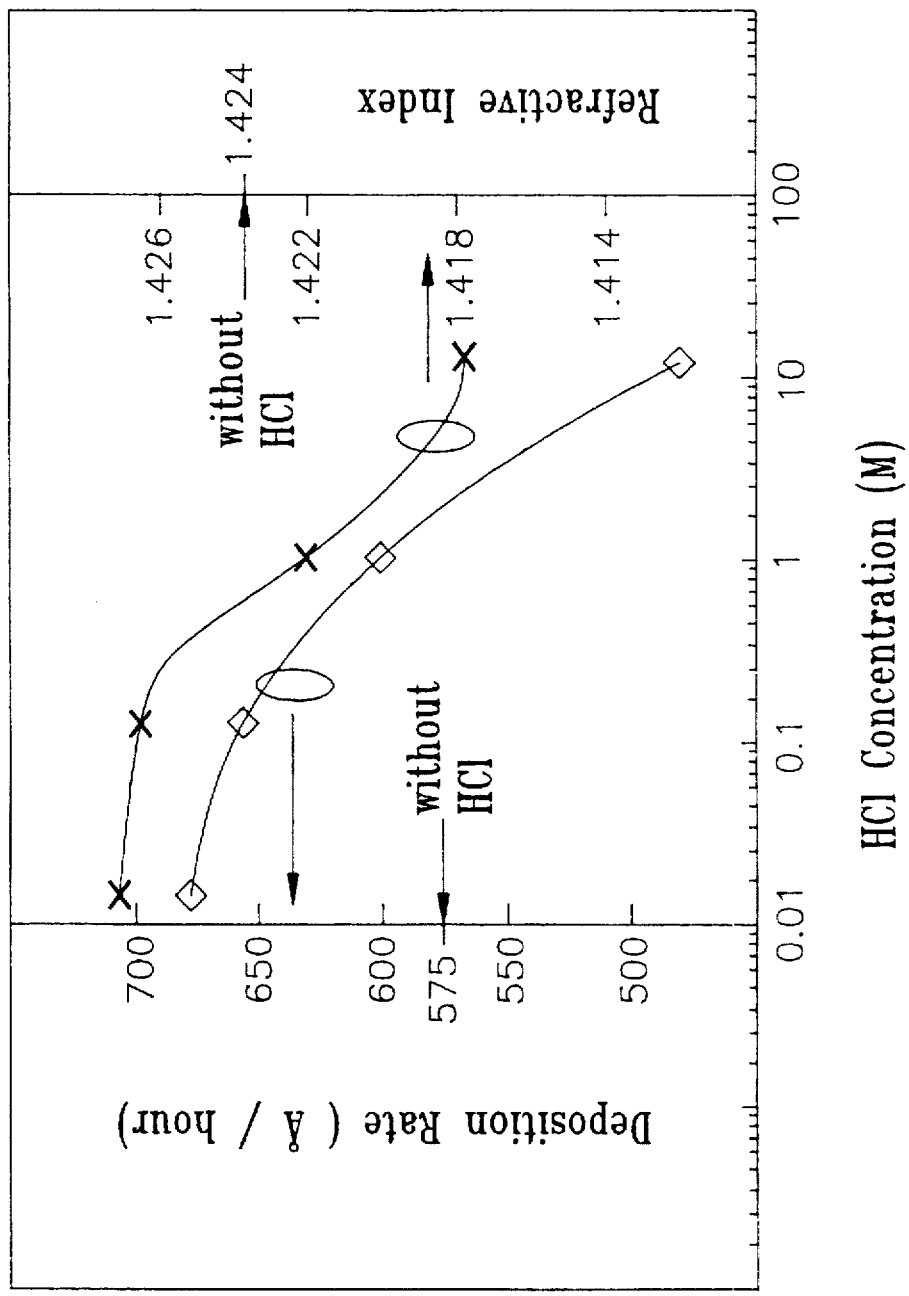
FIG. 1 is a plot showing the effect of hydrochloric acid (HCl) concentration on the deposition rate and the refractive index.

The present invention can be further described with the following example.

Example: the steps of depositing LPD-$SiO_2$ are as follows:

(1) taking 21 g high purity (99.99%) silica gel powder and dissolving it in 450 mL 4M hydrofluorosilicic acid to form a supersaturated solution;

(2) stirring the solution at 23° C. for 17 hours;

(3) filtering the solution in step (2) to separate the undissolved silica gel powder;

(4) taking 64 mL solution in step (3) and diluting it to 3.56M, adding 0.1 M boric acid 5.6 mL into the diluted solution for promoting the deposition of $SiO_2$ and raising the temperature of the solution to 40° C. for depositing LPD-$SiO_2$;

(5) putting a wafer (direction of the substrate: 100; resistivity: 15~25 Ω-cm) into the solution in step (4) to deposit a layer of silicon dioxide. Adding HCl 5 mL into the solution while depositing the oxide layer.

To realize how the addition of HCl influences the growth of the silicon dioxide layer, different amounts of HCl are added into the solution. The deposition rate of the silicon dioxide without adding HCl is 575 Å/hour. The refractive index is 1.424. The deposition rate and the refractive index of the silicon dioxide layers under different concentrations of HCl are shown in FIG. 1.

Figure 2A:
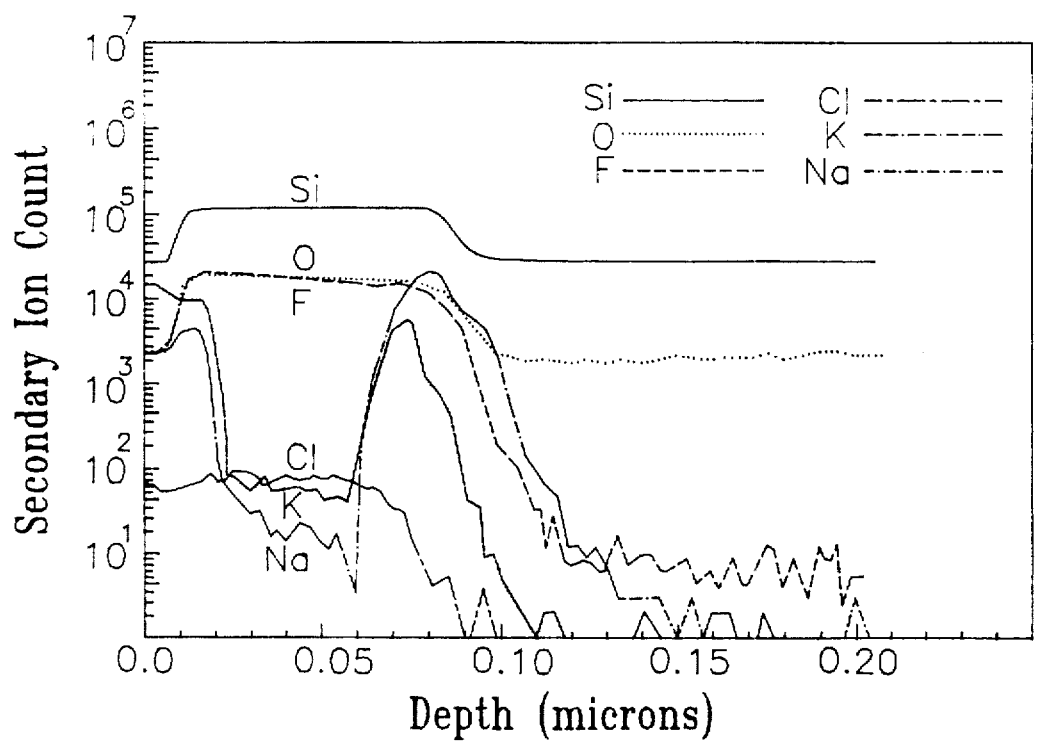
FIG. 2A and 2B are the secondary ion mass spectroscopy (SIMS) analyses of the oxide deposition, wherein in FIG. 2A, the oxide layer is deposited without the addition of alkali metal eliminating agent
Figure 2B:
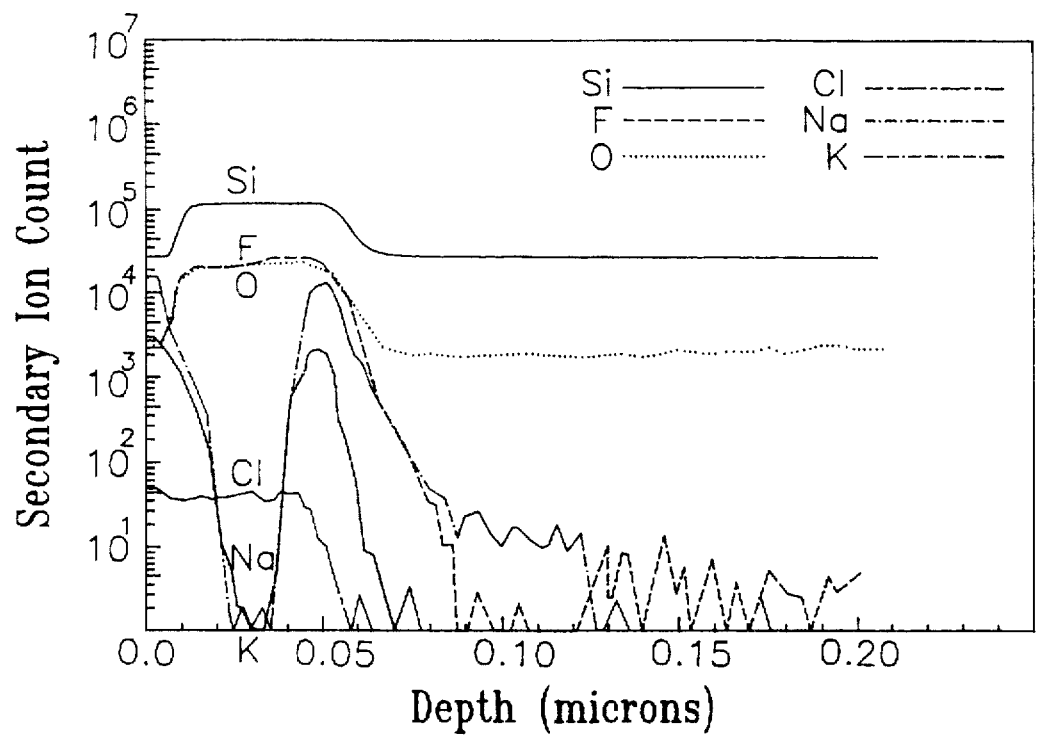
Figure 3A:
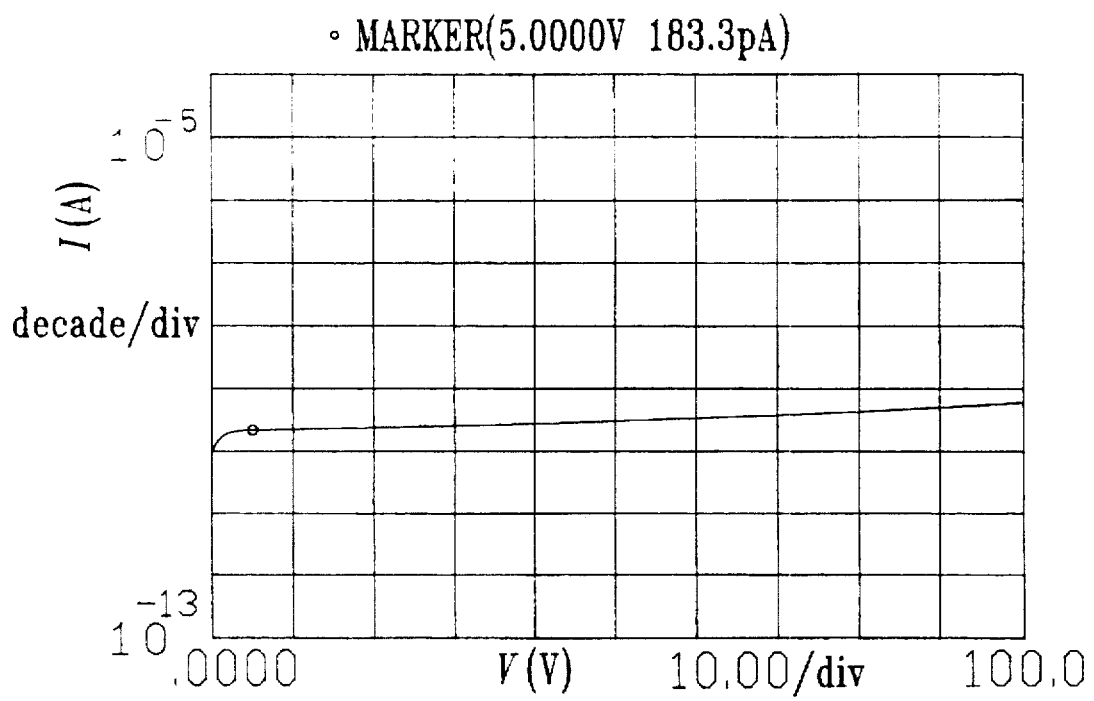
Figure 3B:
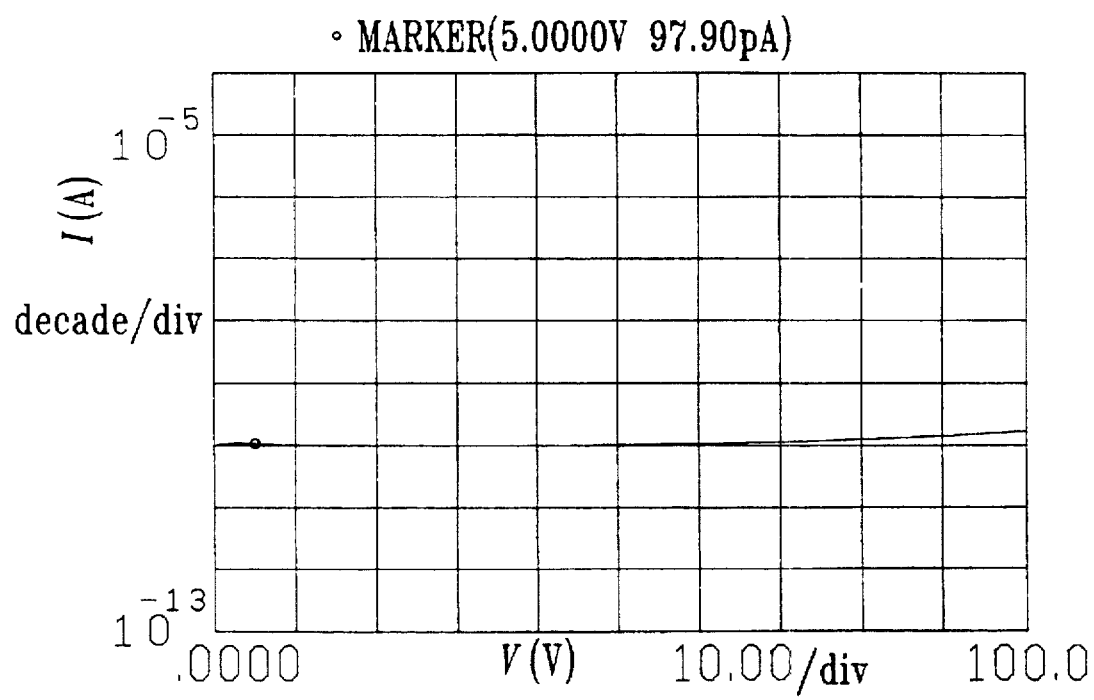

Learning from FIG. 1, if some HCl is added upon depositing, the deposition rate increases to 650 Å/hour, much higher than the previous rate 575 Å. However, if the concentration of HCl exceeds a certain value, the deposition rate is lower. The possible reason is that when HCl is dissolved in aqueous solution, it dissociates into hydrogen ion $H^+$ and chloride ion $Cl^-$. If the concentration of HCl is too high, the excess $Cl^-$ ions are adsorbed on the substrate. This prevents siloxane oligomer from being adsorbed by the O—H bond on the surface of the substrate and causes the deposition rate lower. At the same time, when the HCl concentration is too high, the silicon dioxide layer will contain a large amount of $Cl^-$ ion impurity, and the refractive index decreases with the increase of HCl concentration as shown in FIG. 1. Adding a suitable amount of HCl (as the relative amount in this example) will provide a certain amount of Cl- to neutralize with the alkali metals e.g. $Na^+$, $K^+$ and so as to present the alkali metals from being adsorbed on the surface of the substrate and to raise the deposition rate of silicon dioxide and increase the refractive index of the silicon dioxide layer. In addition, learning from the comparison between FIG. 2A and 2B, the (SIMS) analyses, adding a suitable amount of HCl can reduce the impurities in silicon dioxide layer. As shown in FIG. 2B the concentration of alkali metal is almost 0. In LPD, adding alkali metal eliminating agent will not only increase the deposition rate and refractive index but also reduce the leakage current density, as shown in FIG. 3A and 3B. In FIG. 3A the silicon dioxide layer is deposited by LPD without alkali metal eliminating agent being added during the depositing process. The thickness of the silicon dioxide layer is 950 Å. In FIG. 3B, the silicon dioxide layer is also deposited by LPD and HCl is added as the alkali metal eliminating agent. The thickness of the silicon dioxide is 983 Å. Both of the electrode areas of the silicon dioxide layers are $1.58 \times 10^{-2}$ $cm^2$. Learning from FIG. 3A and FIG. 3B, the leakage current density of the silicon dioxide without being processed by HCl is 11.6 $nA/cm^2$. The leakage current density of the silicon dioxide layer processed by HCl decreases to 6.2 $nA/cm^2$. Even when the voltage is added to 100 V, the leakage current density HCl-processed silicon dioxide will maintain at a certain value.

From the above example, we learn that the oxide layer forming method according to the present invention has following advantages:

1. Raising the depositing rate of silicon dioxide layer;
2. Increasing the refractive index of the silicon dioxide layer (which represents the silicon dioxide is finely deposited); and
3. Effectively reducing the leakage current density.

Furthermore, the steps are simple and easy to control and highly reproducible. These meet the requirements for mass-production.

While the invention has been described in terms of what is presently considered to be the most practical and preferred embodiment, it is to be understood that the invention is not limited to the disclosed embodiment. On the contrary, it is intended to cover various modification and similar arrangements included within the spirit and scope of the appended claims, the scope of which should be accorded the broadest interpretation so as to encompass all such modifications and similar structures.

What is claimed is:

1. A method of forming an oxide layer on a substrate comprising steps of:

a) providing a substrate;
   b) dissolving a silica gel into a hydrofluosilicic acid ($H_2F_6Si$) solution to form a supersaturated solution;
   c) filtering said supersaturated solution to separate an excess undissolved silica gel from said supersaturated solution to obtain a supersaturated solution filtrate;
   d) adding a boric acid solution into the supersaturated solution filtrate to form a boron-containing solution;
   e) immersing said substrate in said boron-containing solution to form said oxide layer; and f) adding an alkali metal eliminating agent to said boron-containing solution while forming said oxide layer.

2. A method for forming an oxide layer as claimed in claim 1, wherein said substrate is a wafer.

3. A method for forming an oxide layer as claimed in claim 2, wherein said oxide layer is a silicon dioxide layer.

4. A method for forming an oxide layer as claimed in claim 1, wherein said step (b) is executed at about 23° C.

5. A method for forming an oxide layer as claimed in claim 1, wherein said step (f) is executed at about 40° C.

6. A method for forming an oxide layer as claimed in claim 1, wherein said alkali metal eliminating agent is an acid.

7. A method for forming an oxide layer as claimed in claim 1, wherein said alkali metal eliminating agent is a hydrochloric acid.

8. A method for forming an oxide layer on a substrate comprising steps of:

a) providing a substrate;
   b) providing a silicon-containing supersaturated solution;
   c) adding a boric acid solution into said silicon-containing supersaturated solution to form a boron-containing solution;
   d) immersing said substrate in said boron-containing solution to form said oxide layer; and e) adding an alkali metal eliminating agent to said boron-containing solution while forming said oxide layer.

9. A method for forming an oxide layer as claimed in claim 8 wherein said substrate is a silicon wafer.

10. A method for forming an oxide layer as claimed in claim 9 wherein said step b) includes steps:

b1) dissolving a silica gel into a hydrofluosilicic acid ($H_2F_6Si$) solution to form a supersaturated solution; and
   b2) filtering said supersaturated solution to separate an excess undissolved silica gel from said supersaturated solution to obtain said silicon-containing supersaturated solution.

11. A method for forming an oxide layer as claimed in claim 10 wherein said step b1) is executed at about 23° C.

12. A method for forming an oxide layer as claimed in claim 10 wherein said step b1) is executed at about 40° C.

13. A method for forming an oxide layer as claimed in claim 8 wherein said alkali metal eliminating agent is an acid.

14. A method for forming an oxide layer as claimed in claim 13 wherein said acid is a hydrochloric acid (HCl) solution.

* * * * *